(12) United States Patent
Lee et al.

(10) Patent No.: US 8,758,513 B2
(45) Date of Patent: Jun. 24, 2014

(54) PROCESSING APPARATUS

(75) Inventors: Jin Seok Lee, Gyeongsangbuk-do (KR); Hyuk Sang Yoon, Busan-si (KR); Hwan Kyu Yoo, Gyeonggi-do (KR); Byeong Eok Hwang, Gyeongsangbuk-do (KR)

(73) Assignees: LG Display Co., Ltd., Seoul (KR); Avaco Co., Ltd., Daegu-si (KR); LG Electronics Inc., Seoul (KR)

( * ) Notice: Subject to any disclaimer, the term of this patent is extended or adjusted under 35 U.S.C. 154(b) by 992 days.

(21) Appl. No.: 11/639,224

(22) Filed: Dec. 15, 2006

(65) Prior Publication Data
US 2007/0137793 A1  Jun. 21, 2007

(30) Foreign Application Priority Data
Dec. 16, 2005 (KR) .................. 10-2005-0124311

(51) Int. Cl.
C23F 1/00 (2006.01)
C23C 16/00 (2006.01)
(52) U.S. Cl.
USPC ...... 118/719; 118/718; 118/729; 204/298.25; 414/935
(58) Field of Classification Search
USPC .................................. 156/345.31
See application file for complete search history.

(56) References Cited

U.S. PATENT DOCUMENTS

| | | | | | |
|---|---|---|---|---|---|
| 4,348,139 | A | * | 9/1982 | Hassan et al. | 406/10 |
| 5,288,329 | A | * | 2/1994 | Nakamura et al. | 118/729 |
| 5,426,865 | A | | 6/1995 | Ikeda | |
| 6,017,396 | A | * | 1/2000 | Okamoto | 118/719 |

FOREIGN PATENT DOCUMENTS

| | | |
|---|---|---|
| JP | 10-308348 A | 11/1998 |
| JP | 2003-059844 A | 2/2003 |
| KR | 1998-086814 A | 12/1998 |
| KR | 10-0268525 B1 | 11/2000 |

* cited by examiner

*Primary Examiner* — Parviz Hassanzadeh
*Assistant Examiner* — Nathan K Ford
(74) *Attorney, Agent, or Firm* — Morgan, Lewis & Bockius LLP (57) ABSTRACT

A processing apparatus includes a loading chamber; a buffer chamber connected to the loading chamber; a first process chamber connected to the buffer chamber; and an unloading chamber connected to the first process chamber, wherein a processing path through the processing apparatus is a forward in-line path in a direction through the loading chamber, the buffer chamber, the first process chamber, and the unloading chamber.

14 Claims, 5 Drawing Sheets

PROCESSING APPARATUS

This application claims the benefit of Korean Patent Application No. 2005-0124311, filed on Dec. 16, 2005, which is hereby incorporated by reference in its entirety.

BACKGROUND OF THE INVENTION

1. Field of the Invention

Embodiments of the present invention relate to a processing apparatus, and more particularly, to a processing apparatus for an LCD device. Embodiments of the present invention are suitable for a wide scope of applications. In particular, an embodiment of the present invention is suitable for providing a processing apparatus capable of improving a manufacturing process efficiency.

2. Description of the Related Art

Generally, semiconductor devices and display panels, such as liquid crystal display devices and organic light emitting display devices, are fabricated in a processing apparatus. The processing apparatus performs repeated manufacturing processes required for processing a wafer for a semiconductor device or a substrate for a display panel. The processing apparatus automates various processes by using robots. This automation facilitates the fabrication and mass production of larger panel size using more complex processes.

Processing apparatuses for semiconductor and LCD devices are classified into a cluster type and an in-line type. A cluster type processing apparatus conveys a substrate horizontally between each chamber. In contrast, an in-line processing apparatus conveys a substrate vertically between each chamber.

Since the cluster-type processing apparatus conveys a substrate horizontally by using a robot, it can block impurity such as particle. However, since the cluster-type processing apparatus includes chambers that correspond to the size of the horizontally-placed substrate, the size of each chamber increases with the size of the substrate. Accordingly, the size of components and the volume of the chamber in the cluster-type processing apparatus increases, thereby increasing the manufacturing cost. These problems can be avoided by using an in-line processing apparatus.

Figure 1:
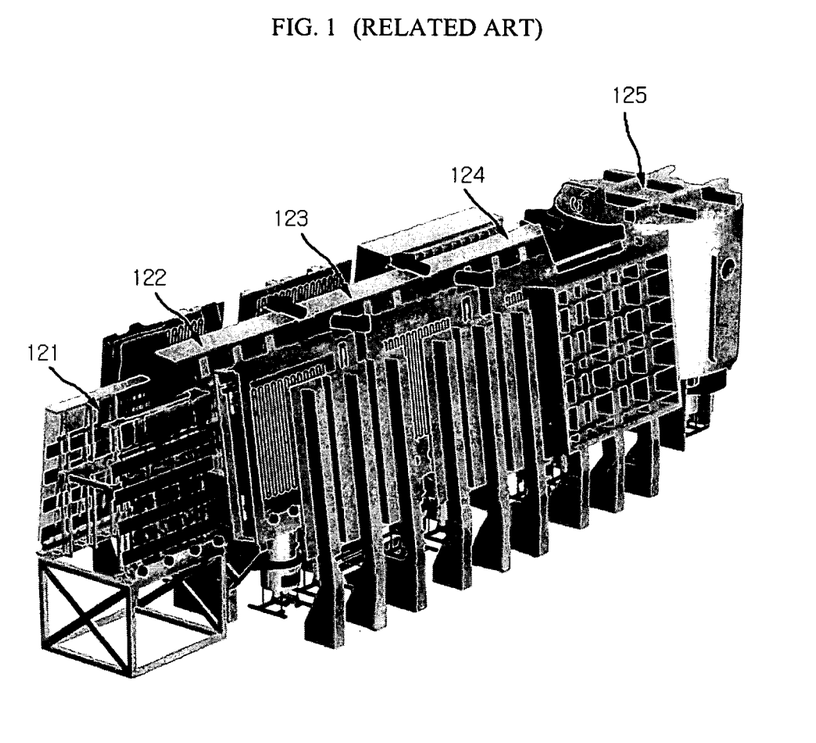
FIG. 1 is a perspective view of an in-line processing apparatus in accordance with the related art.

FIG. 1 is a perspective view of an in-line processing apparatus in accordance with the related art. Referring to FIG. 1, the related art in-line processing apparatus includes five units. For example, the related art in-line processing apparatus includes a conveying unit 121, a loading chamber 122, a buffer chamber 123, a process chamber 124, and a rotation chamber 125. The process chamber 124 may be one of a sputtering chamber, an etching chamber, or an annealing chamber depending on the manufacturing processes.

The in-line processing apparatus transfers a substrate between chambers 121 to 125 in a substantially vertical manner. The conveying unit 121 transfers the externally provided substrate into the loading chamber 122. The loading chamber 122 transfers the substrate into the buffer chamber 123. The buffer chamber 123 is disposed between the loading chamber 122 and the process chamber 124 to perform a buffering function with respect to environmental changes such as a gas atmosphere, a vacuum level, and a temperature between the loading chamber 122 and the process chamber 124, and transfer the substrate into the process chamber 124. The process chamber 124 performs predetermined manufacturing processes (such as, a sputtering process, an etching process, etc.) on the transferred substrate, and then transfers the substrate into the rotation chamber 125.

The rotation chamber 125 rotates the substrate to be transferred back to the process chamber 124, the buffer chamber 123, the loading chamber 122, and the conveying unit 121. Then, the rotated substrate is sequentially transferred to the process chamber 124, the buffer chamber 123, the loading chamber 122, and the conveying unit 121. Then, the substrate is transferred out of the conveying unit 121 to the outside.

Each of chambers 122, 123, and 124 is sealed by a partition dividing the chamber into two chamber spaces. Accordingly, the partition provides different transferring paths to the substrates. A gate valve (not shown) is disposed between each of the chambers 121 to 125 for opening and closing during substrate transfer. As described above, the in-line processing apparatus substantially vertically transfers the substrate that is loaded on a carrier.

Figure 2:
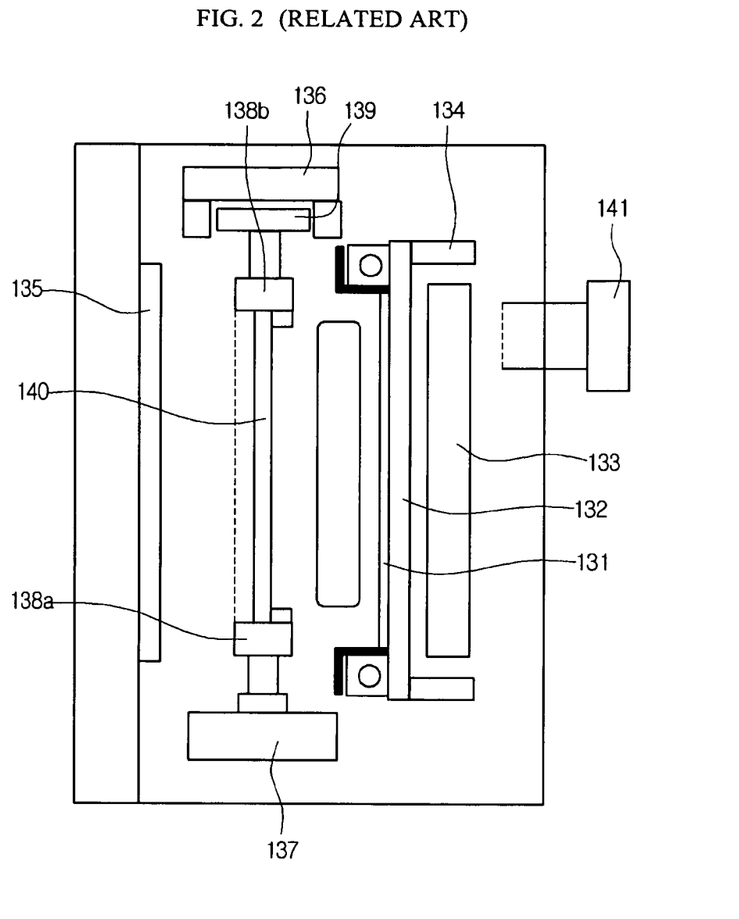
FIG. 2 is a cross-sectional view of a process chamber in the related art in-line processing apparatus of FIG. 1.

FIG. 2 is a cross-sectional view of a process chamber in the related art in-line processing apparatus of FIG. 1. Referring to FIG. 2, a target 131, a cathode 132, and a magnet 133 are disposed on one side of the process chamber 124. A sheath heater 135 is disposed on the other side of the process chamber to face the target 131. A substrate 140 is mounted on top and bottom carriers 138a and 138b and transferred into the process chamber 124 in a standing state. A first magnet 139 having a first polarity is disposed on the top carrier 138b, and a second magnet 136 having a second polarity opposite to the first polarity of the first magnet 139 is mounted on the top of the first magnet 139. A metal belt 137 is mounted on the bottom of the bottom carrier 138a to transfer the substrate 140. The metal belt 137 may be formed of a stainless steel material. For example, the material for the metal belt 137 may be SUS stainless steel. The carriers 138a and 138b may be formed of aluminum material. A vacuum pump 141 discharges air to provide a high pressure in the process chamber 124.

When the substrate 140 is transferred to the process chamber 124 through the metal belt 137, the top and bottom carriers 138a and 138b holding the substrate 140 are fixed at a predetermined position by a magnetic field between the first and second magnets 139 and 136. When the top and bottom carriers 138a and 138b are fixed, a target material is released from the target 131 and deposited on the substrate 140 by using positive ions of gas plasma generated by applying a voltage to the cathode 132. After the deposition process of the target material on the substrate 140, the substrate 140 can be transferred to the next processing stage by the metal belt 137.

Several carriers can be connected to form a continuous transfer path. In the related art in-line processing apparatus of FIG. 1, the conveying unit 121 includes two such carriers; the loading chamber 122 includes two carriers; the buffer chamber 123 includes two carriers; the process chamber 124 includes two carriers; and the rotation chamber 125 includes one carrier. Thus, the related art in-line processing apparatus includes at least nine carriers.

As described above, in the related art processing apparatus, one substrate is fixed at the carrier, and passes through the loading chamber 122, the buffer chamber 123, and the process chamber 124, which performs a predetermined process. Then, the substrate is rotated by the rotation chamber 125, and passes in a reverse order through the process chamber 124, the buffer chamber 123, and the loading chamber 122. Then, the substrate is carried out to the outside. Thus, the substrate to be processed travels back and forth within the related art processing apparatus. Accordingly, in the related art processing apparatus, the substrate passes through the chambers 122, 123, and 124 twice during one processing cycle. Hence, processing time increases, thus decreasing product yield.

Also, the related art processing apparatus selectively uses a buffer chamber. Accordingly, process tack time increases. Hence, product yield is decreased by the increase in process tack time.

Moreover, the related art processing apparatus requires a plurality of carriers. Replacement and maintenance of carriers are difficult. Additionally, each additional carrier increases the volume of the apparatus. Hence, device cost increases with each additional carrier.

SUMMARY OF THE INVENTION

Accordingly, embodiments of the present invention are directed to a processing apparatus that substantially obviates one or more problems due to limitations and disadvantages of the related art.

An object of the present invention is to provide a processing apparatus that improves a product yield.

Another object of the present invention is to provide a processing apparatus that reduces a processing time.

Another object of the present invention is to provide a processing apparatus that reduces a tact time.

Another object of the present invention is to provide a processing apparatus that reduces a device volume and manufacturing cost without using a carrier.

Another object of the present invention is to provide a processing apparatus that reduces a manufacturing cost.

Additional features and advantages of the invention will be set forth in the description of exemplary embodiments which follows, and in part will be apparent from the description of the exemplary embodiments, or may be learned by practice of the exemplary embodiments of the invention. These and other advantages of the invention will be realized and attained by the structure particularly pointed out in the written description of the exemplary embodiments and claims hereof as well as the appended drawings.

To achieve these objects and other advantages and in accordance with the purpose of the invention, as embodied and broadly described herein, a processing apparatus includes a loading chamber; a buffer chamber connected to the loading chamber; a first process chamber connected to the buffer chamber; and an unloading chamber connected to the first process chamber, wherein a processing path through the processing apparatus is a forward in-line path in a direction through the loading chamber, the buffer chamber, the first process chamber, and the unloading chamber.

In another aspect, a processing apparatus includes a loading chamber; a buffer chamber connected to the loading chamber; a process chamber connected to the buffer chamber, the process chamber including first and second heaters therein and a partition between the first and second heaters for forming and sealing independent first and second process spaces in the first process chamber; and an unloading chamber connected to the process chamber, wherein a processing path through the processing apparatus is a forward in-line path in a direction through the loading chamber, the buffer chamber, the process chamber, and the unloading chamber.

In another aspect, a method of processing at least first and second substrates includes loading the first and second substrates to face each other in a loading chamber; transferring the first and second substrates to a buffer chamber connected to the loading chamber to preset a temperature of the substrate; transferring the first and second substrates in a substantially vertical stance from the buffer chamber to respective first and second process spaces formed by a partition between first and second heaters in a first process chamber connected to the buffer chamber; processing the first and second substrates in the first process chamber, including heating the first and second substrates respectively with the first and second heaters; and unloading the first and second substrates in an unloading chamber connected to the first process chamber, wherein the first and second substrates are processed through the processing apparatus is a forward in-line path in a direction through the loading chamber, the buffer chamber, the first process chamber, and the unloading chamber.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF EXEMPLARY EMBODIMENTS

Reference will now be made in detail to exemplary embodiments of the present invention, which are illustrated in the accompanying drawings.

Figure 3:
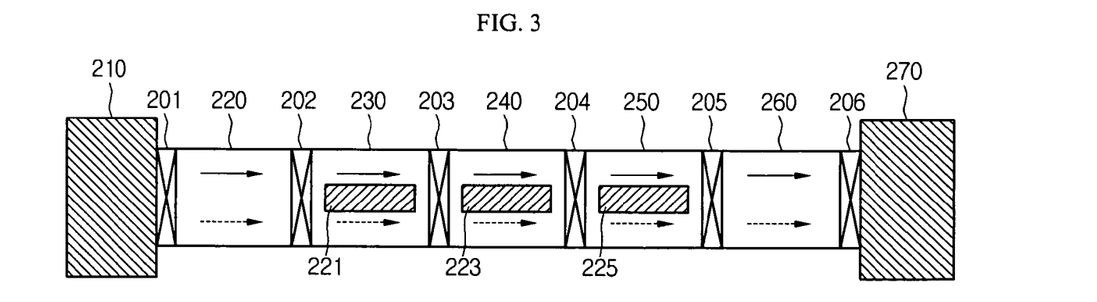
FIG. 3 is a plan view of a first exemplary in-line processing apparatus according to an embodiment of the present invention.

FIG. 3 is a plan view of a first exemplary in-line processing apparatus according to a first embodiment of the present invention. Referring to FIG. 3, an in-line processing apparatus includes a first conveying unit 210, a loading chamber 220, a buffer chamber 230, a first process chamber 240, a second process chamber 250, an unloading chamber 260, and a second conveying unit 270. Gate valves 201, 202, 203, 204, 205 and 206 may be disposed to control a substrate transfer between the first and second conveying units 210 to 270.

The substrate to be processed is placed on the first conveying unit 210. Then, the substrate to be processed is loaded on the loading chamber 220. The buffer chamber 230 temporarily buffers the substrate transferred from the loading chamber 220. The buffering process includes pre-setting vacuum and temperature of the buffer chamber 230. For example, the preset vacuum and temperature can be chosen to be appropriate for the first process chamber 240.

The in-line processing apparatus of FIG. 3 has a substantially straight line structure unlike the U-shaped return structure of the related art processing apparatus of FIG. 1. Accordingly, the substrate starts with the first conveying unit 210, passes through the loading chamber 220, the buffer chamber 230, the first process chamber 240, the second process chamber 250, the unloading chamber 260, and the second conveying unit 270, and then is carried out of the processing apparatus. Thus, rather than unnecessarily traveling back and forth within the processing apparatus, the substrate travels only forward from the first conveying unit 210 into the processing unit through the second conveying unit 270 out of the processing unit. Accordingly, a processing path through the processing apparatus is a forward in-line path in a direction from the first conveying unit 210, through the loading chamber 220, the buffer chamber 230, the first process chamber 240, the second process chamber 250, the unloading chamber 260, and the second conveying unit 270, and out the processing apparatus without a return path through the processing apparatus.

Heaters 221, 223, and 225 are disposed on centers of the buffer chamber 230, the first process chamber 240, and the second process chamber 250, respectively. The heaters 221, 223 and 225 control the temperature of the chambers 230, 240 and 250, respectively. The substrate temperature can be optimized in the chambers 230, 240 and 250 by adjusting the temperature with the heaters 221, 223 and 225, respectively.

In an embodiment of the present invention, two substrates may be simultaneously processed. For example, first and second substrates are transferred into the loading chamber 220 by the conveying unit 210, and then are transferred into the buffer chamber 230 by the loading chamber 220. The first and second substrates are heated by the first heater 221 in the buffer chamber 230. The first heater 221 can be standing substantially vertically. For example, the first heater 221 can be placed between the first and second substrates, which face each other. Accordingly, the first and second substrates are heated by heat emitted from the first heater 221.

The first and second substrates heated in the buffer chamber 230 are transferred into the first process chamber 240. The second heater 223 is disposed on the center of the first process chamber 240. The second heater 223 can be standing substantially vertically. The first and second substrates are heated by the second heater 223.

Next, after a first process is performed in the first process chamber 240, the first and second substrates are transferred into the second process chamber 250. A third heater 225 is disposed on the center of the second process chamber 250. The third heater 225 can be standing substantially vertically. The first and second substrates are heated by the third heater 225. Then, a second process may be performed in the second process chamber 250 on the first and second substrates. Then, the first and second substrates may be carried out of the second processing chamber 250 and the processing apparatus by unloading the first and second substrates through the chamber 260 and the second conveying unit 270.

Accordingly, since the respective first, second third heaters 221, 223, and 225 apply heat on the first and second substrates simultaneously in each chamber 230, 240, and 250, respectively, the first and second substrates share each of the heaters 221, 223, and 225, respectively.

Figure 4:
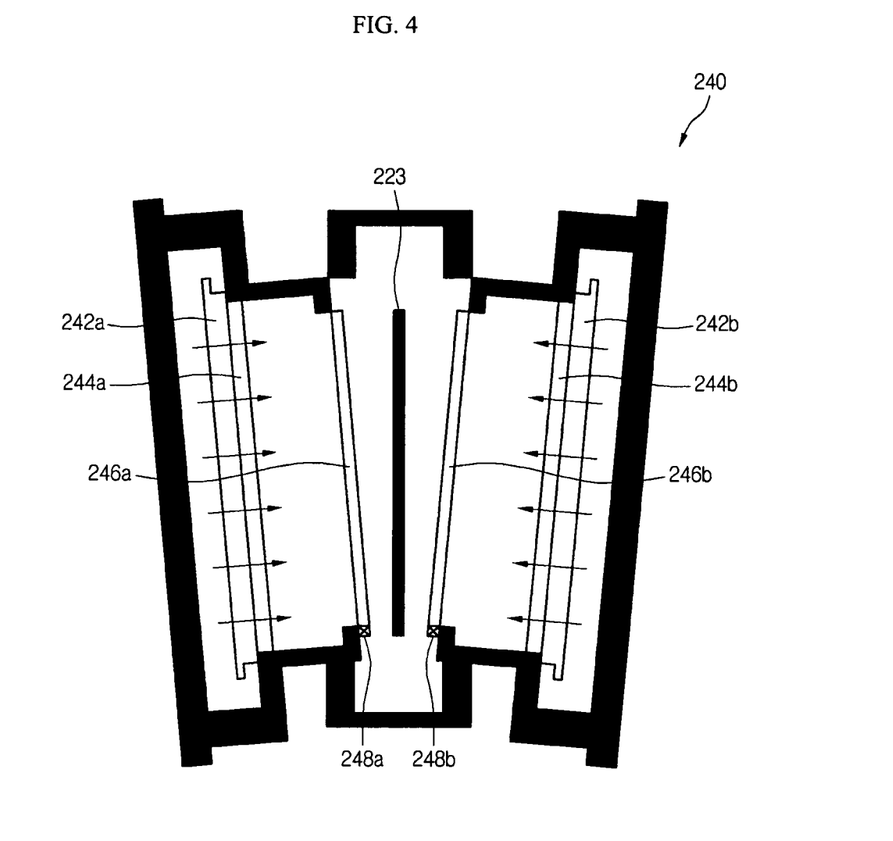
FIG. 4 is a cross-sectional view of an exemplary first process chamber according to an embodiment of the present invention.

FIG. 4 is a cross-sectional view of an exemplary first process chamber according to an embodiment of the present invention. Referring to FIG. 4, the first process chamber 240 includes first and second targets 244a and 244b mounted on first and second cathodes 242a and 242b. First and second magnets (not shown) are disposed on the rear of each of the first and second cathodes 242a and 242b. The second heater 223 is disposed on a center axis between the first and the second cathodes 242a and 242b. The first and second cathodes 242a and 242b, the first and second targets 244a and 244b, the first and second magnets, and the second heater 223 are disposed in a substantially vertical standing.

In this case, the first and second substrates 246a and 246b are transferred in a standing state, the first substrate 246a between the first cathode 242a and the second heater 223, and the second substrate 246b between the second cathode 242b and the second heater 223. The first and second substrates 246a and 246b are seated on first and second roller 248a and 248b, respectively, disposed on the bottom of the first and second substrates 246a and 246b to facilitate the transfer of the first and second substrates 246a and 246b. In an embodiment of the present invention, an air-cushion can be used rather than a carrier during transfer of the substrate.

Figure 5:
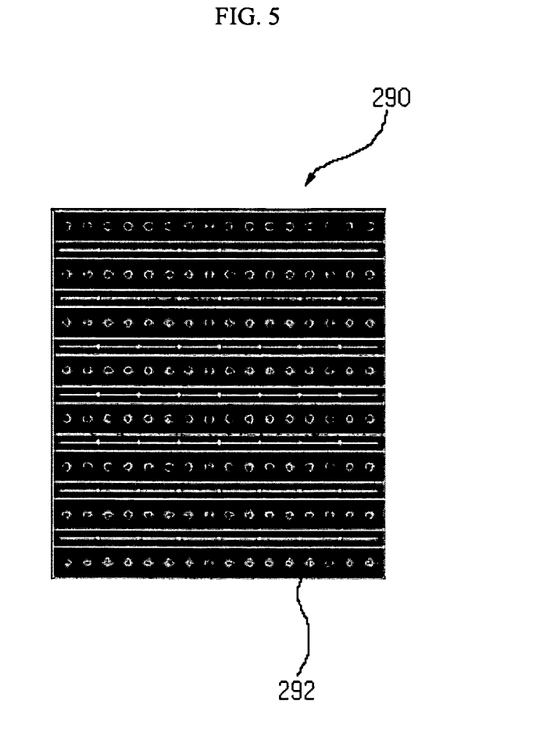
FIG. 5 is a plan view of an exemplary air-pad for generating an air-cushion according to an embodiment of the present invention.

FIG. 5 is a plan view of an exemplary air-pad for generating an air-cushion according to an embodiment of the present invention. Referring to FIGS. 4 and 5, the air-cushion is generated using air-pads 290. A plurality of holes 292 are provided throughout the each of the air-pads 290 for injecting a gas, such as an Ar gas. The holes 292 are spaced from each other by a predetermined distance. The standing substrate 246a and 246b face the air pads 290, respectively, and are maintained in a balanced and substantially vertical state by the pressure generated by the injected gas through the plurality of holes 292. The air pads 290 may be attached to each of the chambers 220 to 260.

Thus, during the transfer operation, the first and second substrates 246a and 246b, facing each other, are spaced apart from the cathodes 242a and 242b by a predetermined distance by the air-cushion generated in each of the chambers 220 to 260 by the pressure due to the air injected by the air pads 290 in each of the chambers.

In an embodiment of the present invention, the second process chamber 250 can be removed. Thus, the first process chamber 240 may be directly connected to the unloading chamber 260. Accordingly, tack time and product yield can be improved.

In accordance with an embodiment of the present invention, two substrates are simultaneously processed through the processing apparatus. Thus, processing time drastically decreases. Hence, product yield increases.

Moreover, in accordance with an embodiment of the present invention, an additional buffer chamber 230 is not required between the second process chamber 250 and the unloading chamber 260 unlike the related art processing apparatus.

Moreover, in accordance with an embodiment of the present invention, the first process chamber 240 can be attached directly to the unloading chamber 260 by removing the second process chamber 250 to reduce tack time and improve product yield.

Moreover, in accordance with an embodiment of the present invention, the substrate is supported by an air-cushion. Thus, carrier replacement and maintenance can be avoided. Hence, device volume and cost can be reduced.

Figure 6:
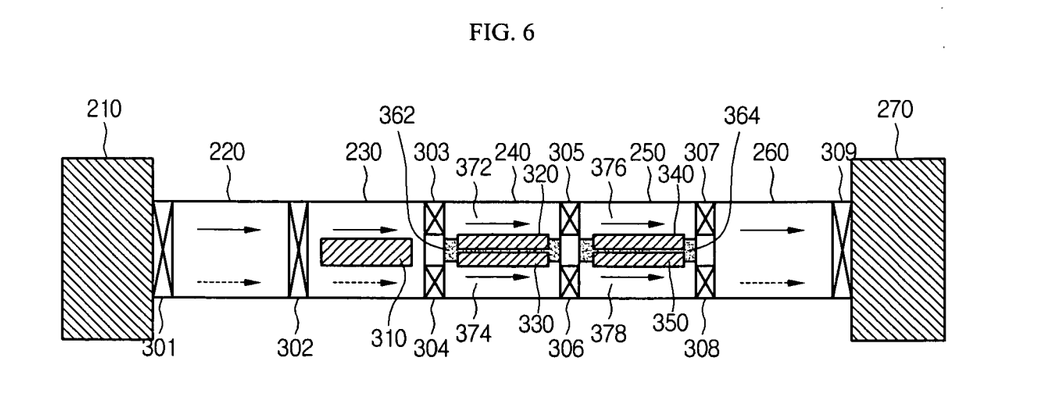
FIG. 6 is a plan view of a second exemplary in-line processing apparatus according to another embodiment of the present invention.

FIG. 6 is a plan view of a second exemplary in-line processing apparatus according to another embodiment of the present invention. Referring to FIG. 6, the second exemplary in-line processing apparatus includes components similar to those of the first exemplary in-line processing apparatus described above in reference to FIG. 3. Accordingly, the same reference numbers will be used throughout the drawings to refer to substantially same or similar parts.

As illustrated in FIG. 6, the second exemplary in-line processing apparatus includes a first conveying unit 210, a loading chamber 220, a buffer chamber 230, a first process chamber 240, a second process chamber 250, an unloading chamber 260, and a second conveying unit 270. The buffer chamber 230 includes one heater 310. Two heaters are disposed at the center of each of the first and second process chambers 240 and 250. For example, first and second heaters 320 and 330 are placed substantially in parallel and spaced apart by a predetermined distance from each other at the center of the first process chamber 240. Third and fourth heaters 340 and 350 are placed substantially in parallel and spaced apart by a predetermined distance from each other at the center of the second process chamber 250.

A first partition 362 is disposed between the first and second heaters 320 and 330 at the center of the first process chamber 240. The first partition 362 forms independent first and second process spaces in the first process chamber 240. The first and second process spaces are sealed by the first partition 362. Likewise, a second partition 364 is disposed between the third and fourth heaters 340 and 350 at the center of the second process chamber 250. The second partition 364 forms independent third and fourth process spaces in the second process chamber 250. The third and fourth process spaces are sealed by the second partition 364.

Because of the first partition 362 provided in the first process chamber 240, different processes may be performed in the first and second process spaces formed by the first partition 362. For example, a sputtering process can be performed on a metal material in the first process space of the first process chamber 240, while a sputtering process can be performed on an indium tin oxide (ITO) material in the second process space of the first process chamber 240. Similarly, different processes can also be performed in the second process chamber 250 because of the third and fourth process spaces formed in the second process chamber 250. Thus, the first and second partitions 362 and 364 form different process spaces in the first and second process chambers 240 and 250, respectively.

Gate valves 301 to 309 are disposed between the chambers 210 to 270. Unlike the first exemplary in-line processing apparatus, two gate valves 303 and 304 are disposed between the buffer chamber 230 and the first process chamber 240. Similarly, two gate valves 305 and 306 are disposed between the first process chamber 240 and the second process chamber 250. Moreover, two gate valves 307 and 308 are disposed between the second process chamber 250 and the unloading chamber 260. Thus, each of the gate valves 303 and 304, 305 and 306, 307 and 308 may be independently driven and controlled to perform different processes at respectively different pressures, temperatures and conditions in each of the process spaces formed in the first and second process chambers 240 and 250.

In accordance with an embodiment of the present invention, simultaneous independent processes can be performed on two substrates in a single process chamber. Thus, processing time can be reduced and product yield improved.

Moreover, in accordance with an embodiment of the present invention, an additional buffer chamber 230 is not required between the second process chamber 250 and the unloading chamber 260 unlike the related art processing apparatus.

Moreover, in accordance with an embodiment of the present invention, the first process chamber 240 can be attached directly to the unloading chamber 260 by removing the second process chamber 250 to reduce tack time and improve product yield.

Moreover, in accordance with an embodiment of the present invention, the substrate is transferred and supported by an air-cushion. Thus, carrier replacement and maintenance can be avoided. Hence, device volume and cost can be reduced.

Moreover, in accordance with an embodiment of the present invention, each process chamber may include independent first and second process spaces. Thus, respectively independent processes can be performed simultaneously in each process chamber. Hence, a manufacturing efficiency of the processing apparatus can be improved.

Figure 7:
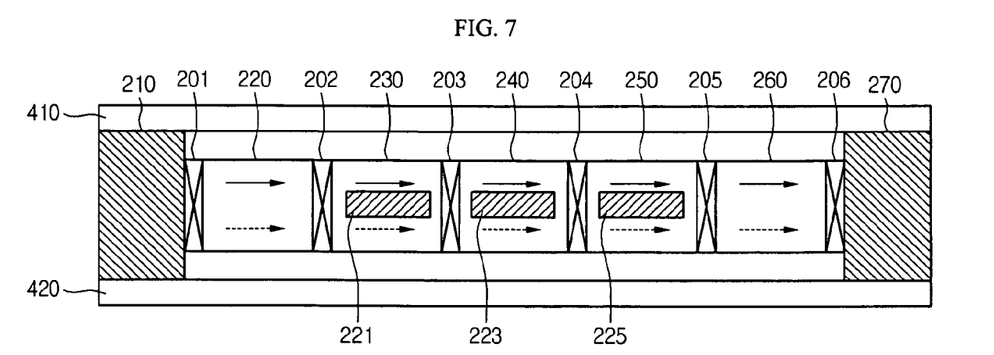
FIG. 7 is a plan view of a third exemplary in-line processing apparatus according to another embodiment of the present invention.

FIG. 7 is a plan view of a third exemplary in-line processing apparatus according to another embodiment of the present invention. Referring to FIG. 7, the third exemplary in-line processing apparatus is similar to the first exemplary in-line processing apparatus. However, the third exemplary in-line processing apparatus uses a carrier instead of an air-cushion like the first exemplary in-line processing apparatus. When the carrier cannot be changed, an additional conveying guide chamber may be required to transfer a substrate to an original conveying unit.

As shown in FIG. 7, the third exemplary in-line processing apparatus includes a first conveying unit 210, a loading chamber 220, a buffer chamber 230, a first process chamber 240, a second process chamber 250, an unloading chamber 260, and a second conveying unit 270. Gate valves 201 to 206 are disposed between the units 210 to 270 to control substrate transfer.

A carrier (not shown), with a substrate attached thereto, passes through the first conveying unit 210, the loading chamber 220, the buffer chamber 230, the first process chamber 240, the second process chamber 250, and the unloading chamber 260, and then is transferred into the second conveying unit 270. In this case, the carrier transferred into the second conveying unit 270 carries the processed substrate out of the processing apparatus. Then, the carrier is returned to the entrance of the processing apparatus for fixing and transferring other substrates in the first conveying unit 210 for another process.

Accordingly, first and second conveying guide chambers 410 and 420 are disposed between the second conveying unit 270 and the first conveying unit 210 to guide the carrier from the second conveying unit 270 back to the first conveying unit 210. In this case, the first and second conveying guide chambers 410 and 420 may be spaced a predetermined distance apart from the loading chamber 220, the buffer chamber 230, the first process chamber 240, the second process chamber 250, and the unloading chamber 260.

The third in-line processing apparatus processes two substrates simultaneously. The two substrates are transferred on the first and second carriers into the first conveying unit 210. The two substrates are transferred on the first and second carriers, respectively, through the loading chamber 220, the buffer chamber 230, the first process chamber 240, the second process chamber 250, and the unloading chamber 260, and into the second conveying unit 270.

The first and second carriers are transferred from the second conveying unit 270 back to the first conveying unit 210. The first and second conveying guide chambers 410 and 420 are disposed between the second conveying unit 270 and the first conveying unit 210 to guide the first and second carriers from the second conveying unit 270 back to the first conveying unit 210. In this case, the first and second conveying guide chambers 410 and 420 may be spaced a predetermined distance apart from the loading chamber 220, the buffer chamber 230, the first process chamber 240, the second process chamber 250, and the unloading chamber 260, between the second conveying unit 270 and the first conveying unit 210.

The first and second conveying guide chambers 410 and 420 maintain a vacuum state, and include a line in the bottom thereof for transferring the first and second carriers. The first and second conveying guide chambers 410 and 420 can transfer a plate-shaped carrier substantially horizontally or vertically.

In accordance with an embodiment of the present invention, the processing apparatus includes first and second carriers and corresponding first and second conveying guide chambers 410 and 420 to simultaneously process two substrates attached thereto. Thus, processing time is reduced and product yield is improved.

Moreover, in accordance with an embodiment of the present invention, an additional buffer chamber 230 is not required between the second process chamber 250 and the unloading chamber 260 unlike the related art processing apparatus.

Moreover, in accordance with an embodiment of the present invention, the first process chamber 240 can be attached directly to the unloading chamber 260 by removing the second process chamber 250 to reduce tack time and improve product yield.

Figure 8:
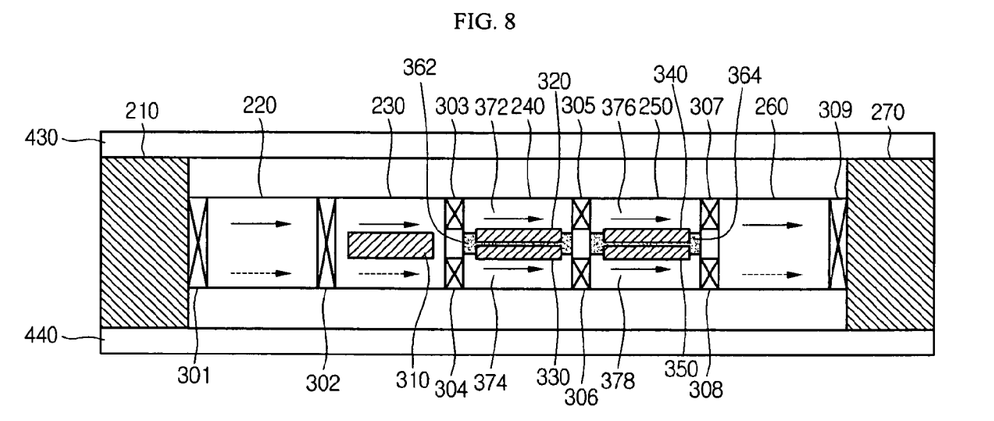
FIG. 8 is a plan view of a fourth exemplary in-line processing apparatus according to another embodiment of the present invention.

FIG. 8 is a plan view of a fourth exemplary in-line processing apparatus according to another embodiment of the present invention. Referring to FIG. 8, the fourth exemplary in-line processing apparatus is similar to the second exemplary in-line processing apparatus. However, the fourth exemplary in-line processing apparatus uses a carrier instead of an air-cushion like the second exemplary in-line processing apparatus. When the carrier cannot be changed, an additional conveying guide chamber may be required to transfer a substrate to an original conveying unit.

As shown in FIG. 8, the in-line processing apparatus includes a first conveying unit 210, a loading chamber 220, a buffer chamber 230, a first process chamber 240, a second process chamber 250, an unloading chamber 260, and a second conveying unit 270.

A carrier (not shown), with a substrate attached thereto, passes through the first conveying unit 210, the loading chamber 220, the buffer chamber 230, the first process chamber 240, the second process chamber 250, and the unloading chamber 260, and then is transferred into the second conveying unit 270. In this case, the carrier transferred into the second conveying unit 270 carries the processed substrate attached thereto out of the processing apparatus. Then, the carrier is returned to the entrance of the processing apparatus for fixing thereto other substrates for transfer into the first conveying unit 210 for another process.

Accordingly, first and second conveying guide chambers 430 and 440 are disposed between the second conveying unit 270 and the first conveying unit 210 to guide the carrier from the second conveying unit 270 back to the first conveying unit 210. In this case, the first and second conveying guide chambers 430 and 440 may be spaced a predetermined distance apart from the loading chamber 220, the buffer chamber 230, the first process chamber 240, the second process chamber 250, and the unloading chamber 260.

The fourth in-line processing apparatus processes two substrates simultaneously. The two substrates are transferred on the first and second carriers into the first conveying unit 210. The two substrates are transferred on the first and second carriers, respectively, through the loading chamber 220, the buffer chamber 230, the first process chamber 240, the second process chamber 250, and the unloading chamber 260, and into the second conveying unit 270.

The first and second carriers are transferred from the second conveying unit 270 back to the first conveying unit 210. The first and second conveying guide chambers 430 and 440 are disposed between the second conveying unit 270 and the first conveying unit 210 to guide the first and second carrier from the second conveying unit 270 back the first conveying unit 210. In this case, the first and second conveying guide chambers 430 and 440 may be spaced a predetermined distance apart from the loading chamber 220, the buffer chamber 230, the first process chamber 240, the second process chamber 250, and the unloading chamber 260, between the second conveying unit 270 and the first conveying unit 210.

The first and second conveying guide chambers 430 and 440 maintain a vacuum state, and include a line in the bottom thereof for transferring the first and second carriers. The first and second conveying guide chambers 430 and 440 can transfer a plate-shaped carrier substantially horizontally or vertically.

As illustrated in FIG. 8, the fourth exemplary in-line processing apparatus includes a first conveying unit 210, a loading chamber 220, a buffer chamber 230, a first process chamber 240, a second process chamber 250, an unloading chamber 260, and a second conveying unit 270. The buffer chamber 230 includes one heater 310. Two heaters are disposed at the center of each of the first and second process chambers 240 and 250. For example, first and second heaters 320 and 330 are placed substantially in parallel and spaced apart by a predetermined distance from each other at the center of the first process chamber 240. Third and fourth heaters 340 and 350 are placed substantially in parallel and spaced apart by a predetermined distance from each other at the center of the second process chamber 250.

In accordance with an embodiment of the present invention, the processing apparatus includes first and second carriers and corresponding first and second conveying guide chambers 430 and 440 to simultaneously process two substrates attached thereto. Thus, processing time is reduced and product yield is improved.

Moreover, in accordance with an embodiment of the present invention, an additional buffer chamber 230 is not required between the second process chamber 250 and the unloading chamber 260 unlike the related art processing apparatus.

Moreover, in accordance with an embodiment of the present invention, the first process chamber 240 can be attached directly to the unloading chamber 260 by removing the second process chamber 250 to reduce tack time and improve product yield.

Moreover, in accordance with an embodiment of the present invention, each process chamber may include independent first and second process spaces. Thus, respectively independent processes can be performed simultaneously in each process chamber. Hence, a manufacturing efficiency of the processing apparatus can be improved.

Moreover, in accordance with an embodiment of the present invention, each chamber is disposed in a straight line such that selectively unnecessary chambers are not included in the processing apparatus. Thus, tact time can be reduced and product yield improved.

Moreover, in accordance with an embodiment of the present invention, an air-cushion may be used instead of a carrier. Thus, device volume and manufacturing cost can be reduced.

It will be apparent to those skilled in the art that various modifications and variations can be made in the exemplary embodiments the processing apparatus of the present invention. Thus, it is intended that embodiments of the present invention cover the modifications and variations of the embodiments described herein provided they come within the scope of the appended claims and their equivalents.

What is claimed is:

1. A processing apparatus, comprising:
a loading chamber;
a buffer chamber connected to the loading chamber;
a first process chamber connected to the buffer chamber;
an unloading chamber connected to the first process chamber, and
an air pad disposed in each of the chambers,
a heater in respective centers of each of the buffer chamber and the first process chamber for controlling a temperature of first and second substrates,
wherein a processing path through the processing apparatus is a forward in-line path in a direction through the loading chamber, the buffer chamber, the first process chamber, and the unloading chamber,
wherein each air pad has a plurality of holes for injecting a gas,
wherein the first and second substrates are maintained in a balanced and substantially vertical state by a pressure by the gas generated by the air pad,
wherein the first and second substrates are seated respectively on rollers to transfer the substrates through the processing path,
wherein the first process chamber includes first and second targets mounted on first and second cathodes, and
wherein the first substrate paralleling with the first cathode is disposed between the first cathode and the heater,
the second substrate paralleling with the second cathode is disposed between the second cathode and the heater, and
the first and second substrates are non-parallel with the heater.

2. The processing apparatus according to claim 1, wherein the first process chamber unit simultaneously processes the first and second substrates.

3. The processing apparatus according to claim 1, wherein the heater comprises first and second heaters in the first process chamber; and a partition is formed between the first and second heaters for forming and sealing independent first and second process spaces in the first process chamber.

4. The processing apparatus according to claim 3, wherein the first and second heaters operate independently in each of the first and second process spaces.

5. The processing apparatus according to claim 3, wherein the first and second substrates are disposed in the first process chamber for independent processing in each of the first and second process spaces, respectively.

6. The processing apparatus according to claim 1, further comprising a second process chamber connected to the first process chamber between the first process chamber and the unloading chamber.

7. The processing apparatus according to claim 1, further comprising first and second conveying guide chambers between the unloading chamber and the loading chamber.

8. The processing apparatus according to claim 7, wherein the first and second conveying guide chambers are spaced apart from each of all chambers excluding the first and second conveying guide chambers.

9. A processing apparatus comprising:
a loading chamber unit;
a buffer chamber unit connected to the loading chamber unit;
a process chamber unit connected to the buffer chamber unit;
an unloading chamber unit connected to the process chamber unit, and
an air pad disposed in each of the chambers,
wherein a heater is disposed in the center of each of the chamber units,
wherein each air pad has a plurality of holes for injecting a gas,
wherein first and second substrates are maintained in a balanced and substantially vertical state by a pressure by the gas generated by the air pad,
wherein the first and second substrates are seated respectively on rollers to transfer the substrates through each of the chambers,
wherein the first process chamber includes first and second targets mounted on first and second cathodes, and
wherein the first substrate paralleling with the first cathode is disposed between the first cathode and the heater,
the second substrate paralleling with the second cathode is disposed between the second cathode and the heater, and
the first and second substrates are non-parallel with the heater.

10. The processing apparatus according to claim 9, wherein each of the chamber units is disposed in a straight line.

11. The processing apparatus according to claim 9, wherein the first process chamber unit simultaneously processes the first and second substrates.

12. The processing apparatus according to claim 11, wherein the first and second substrates are temperature-controlled by the heater simultaneously.

13. The processing apparatus according to claim 9, wherein the heater comprises first and second heaters spaced a predetermined distance apart from each other.

14. The processing apparatus according to claim 13, further comprising a partition disposed between the first and second heaters to form first and second process spaces.

* * * * *